United States Patent
Sukekawa (12) 
(10) Patent No.: US 6,309,960 B1
(45) Date of Patent: Oct. 30, 2001

(54) METHOD OF FABRICATING A SEMICONDUCTOR DEVICE

(75) Inventor: Mitsunari Sukekawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/533,033

(22) Filed: Mar. 22, 2000

(30) Foreign Application Priority Data

Mar. 26, 1999 (JP) .................................................. 11-084307

(51) Int. Cl.[7] ........................ H01L 21/4763; H01L 21/44
(52) U.S. Cl. .......................... 438/629; 438/637; 438/666; 438/667; 438/672
(58) Field of Search ..................................... 438/637, 618, 438/620, 622, 639, 645, 647, 253, 254, 675, 666, 672, 667, 629

(56) References Cited

U.S. PATENT DOCUMENTS

| | | | |
|---|---|---|---|
| 5,871,685 | * | 2/1999 | Tao et al. ................................ 216/60 |
| 5,994,228 | * | 11/1999 | Jeng et al. ............................ 438/698 |
| 6,080,620 | * | 6/2000 | Jeng ....................................... 438/253 |
| 6,083,845 | * | 7/2000 | Yang et al. ............................ 438/737 |
| 6,090,304 | * | 7/2000 | Zhu et al. ............................... 216/79 |
| 6,159,839 | * | 12/2000 | Jeng et al. ............................. 438/618 |

FOREIGN PATENT DOCUMENTS

| | | | |
|---|---|---|---|
| 0 337 109 | | 10/1989 | (EP) . |
| 2 289 984 | | 12/1995 | (GB) . |
| 05029246-A | * | 2/1993 | (JP) ................................ H01L/21/28 |
| 5-247673 | | 9/1993 | (JP) . |
| 6-29263 | | 2/1994 | (JP) . |
| 6-132252 | | 5/1994 | (JP) . |
| 9-205185 | | 8/1997 | (JP) . |
| 2000077535-A | * | 3/2000 | (JP) ............................. H01L/21/8234 |
| WO99/16118 | | 4/1999 | (WO) . |

* cited by examiner

*Primary Examiner*—Charles Bowers
*Assistant Examiner*—Brook Kebede
(74) *Attorney, Agent, or Firm*—Hutchins, Wheeler & Dittmar (57) ABSTRACT

In a method for fabricating a semiconductor device, this method comprising the steps of: forming a contact hole (208) so as to cause the etching stopper (205) on the substrate (201) to be exposed; removing an exposed etching stopper (205) on the substrate; filling the contact hole (208) to form a contact plug (210); removing a film (209) that is deposited on the interlayer insulation film (206), so as to expose the contact plug (210); etching the interlayer insulation film (206) and removing the etching stopper (205) on the gate electrode (203); forming an interlayer insulation film (211); etching the interlayer insulation film (211) so as to expose the etching stopper (205) on a diffusion layer (231) and etching the insulation film (204) of the gate electrode (203), so as to form contact holes (213) on the diffusion layer (231) and the gate electrode (203); removing the etching stopper (205) exposed on the diffusion layer (231); and filling the contact hole (213), so as to form the contact plugs (215).

11 Claims, 9 Drawing Sheets

PRIOR ART

METHOD OF FABRICATING A SEMICONDUCTOR DEVICE

BACKGROUND OF THE INVENTION

1. Field of the Invention

The present invention relates to a semiconductor device and to a method of fabricating a semiconductor device, and more particularly it relates to a semiconductor device and method of fabricating same which eliminates over-etching and achieves stable transistor characteristics.

2. Background of the Invention

In an interconnect technology making use of self-alignment process to form contacts in a semiconductor device, and particularly a method of forming a self-aligning contact using an etching stopper made of a silicon nitride film was accompanied by the following problems in the past.

Figure 8:
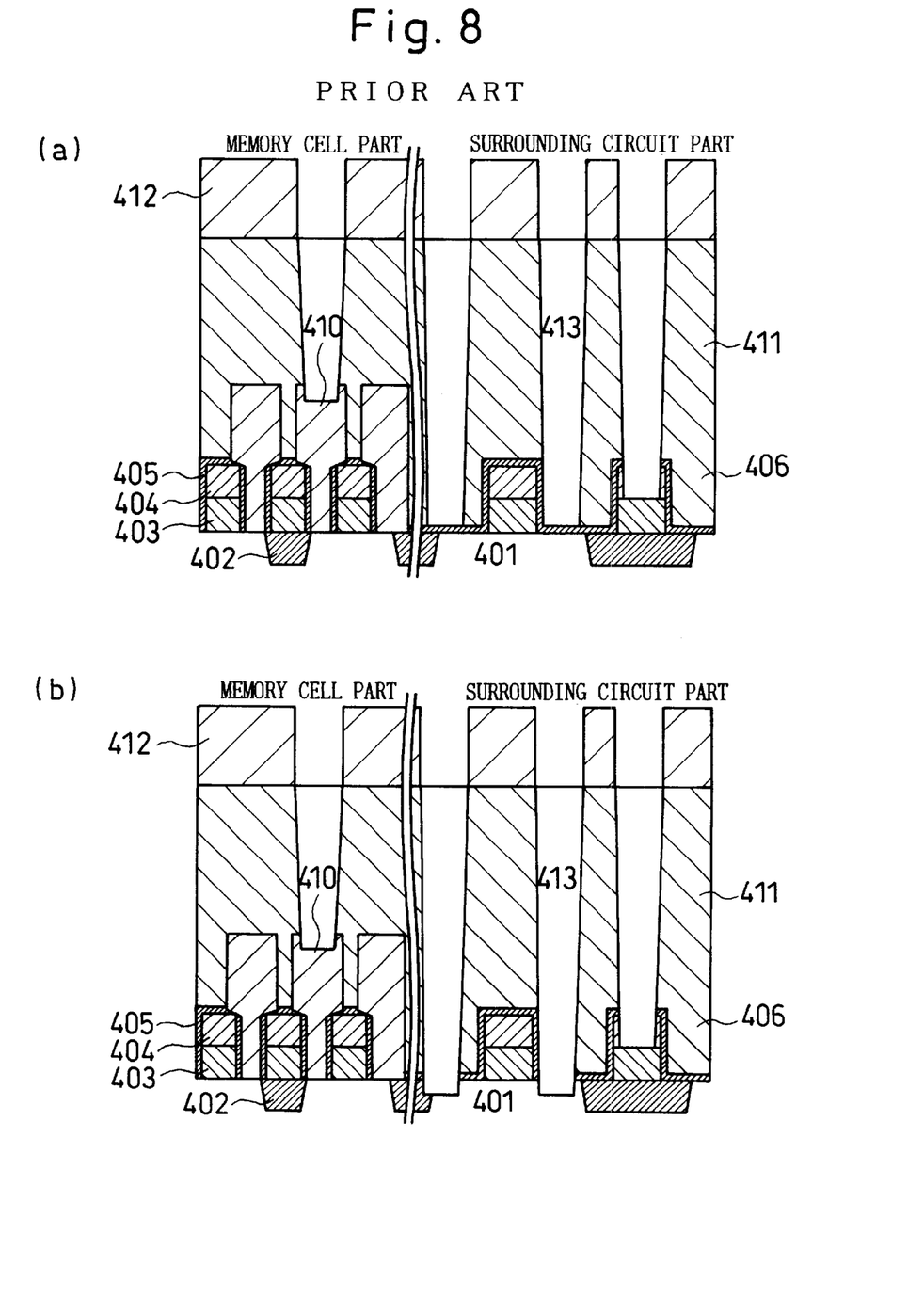
FIG. 8(a) and FIG. 8(b) are drawings showing a method for fabricating a semiconductor device according to the prior art.

FIG. 8 shows cross-section views of process diagrams illustrating the application of a general self-aligning contact process to a memory device.

As shown in FIG. 8(a), a gate electrode 403 and an insulation film 404 made of a silicon nitride film are formed on a silicon substrate 401 and an element separation region 402, and then a silicon nitride film 405 serving as an etching stopper is deposited so as to cover the gate electrode and the silicon substrate. Then after forming a BPSG film 406 as an interlayer insulation film, self-aligning contact etching is done to form a contact plug 410. Then, after forming an interlayer insulation film 411 using a CVD process, a contact pattern is formed on photoresist 412, this being used as a mask to etch the BPSG film 406.

After the above, as shown in FIG. 8(b), the silicon nitride film 405 is etched. When doing this, if the usual nitride film etching is done with a fluorocarbon gas such as $CF_4$, because it is not possible to achieve a selection ratio with respect to the silicon substrate, the silicon substrate 401 is simultaneously etched.

Figure 9:
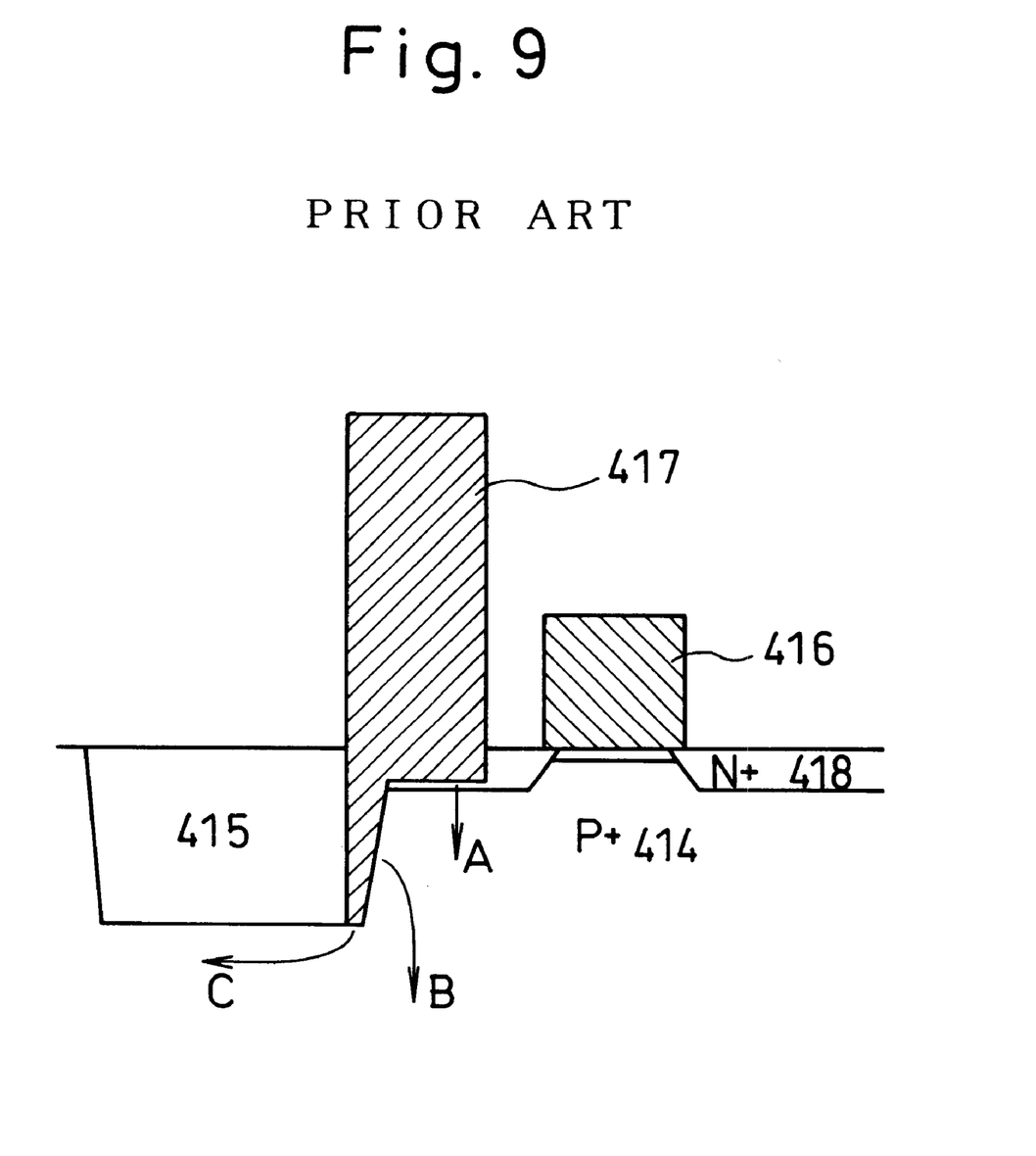
FIG. 9 is a drawing showing a semiconductor device according to the prior art.

As shown in FIG. 9, which is a simplified drawing of a transistor structure, each transistor on a p-type silicon substrate 414, for example, is separated by a field oxide film 415 and, the transistor is formed by a gate electrode 416, an n-type diffusion layer 418 that will serve as a source and drain, and a contact electrode 417, when the n-type diffusion layer made of silicon is over-etched, there is current leakage in the direction A indicated in FIG. 9, the result being that it is not possible to achieve stable transistor characteristics.

While the above applies to the case in which an insulation film 404 over the gate electrode is a silicon nitride film, even in the case in which this insulation film 404 over the gate is a silicon oxide film, for the same reason as described above, the field oxide film 415 is etched, in which case there is current leakage in the direction B or the direction C indicated in FIG. 9, the result being that it is not possible to achieve stable transistor characteristics.

In the Japanese Unexamined Patent Publication (KOKAI) No. H9-205185, there is a method for removing the silicon nitride film from over the gate beforehand. This method, however, requires an extra lithography process, thereby causing the problem of an increased number of process steps.

Accordingly, in view of the above-noted drawbacks in the prior art, it is an object of the present invention to provide a novel method for fabricating a semiconductor device, whereby over-etching is prevented without the need to increase the number of lithography steps, and which achieves stable transistor characteristics.

SUMMARY OF THE INVENTION

In order to achieve the above-noted objects, the first aspect of the present invention has the following basic technical constitution.

Specifically, the first aspect of the present invention is a method for fabricating a semiconductor device having a contact plug, this method comprising the steps of: a first step of forming a polysilicon film and an insulation film on a semiconductor substrate, and then etching the polysilicon film and the insulation film to a prescribed shape, so as to form a gate electrode, after which an etching stopper is formed on an entire surface of the substrate and an interlayer insulation film is formed over the entire surface thereof; a second step of forming a contact hole that reaches the semiconductor substrate in the interlayer insulation film, so as to cause the etching stopper on the semiconductor substrate to be exposed; a third step of removing an exposed etching stopper on the semiconductor substrate; a fourth step of filling the contact hole to form a contact plug; a fifth step of removing a film that is deposited on the interlayer insulation film when the contact plug is formed, so as to expose the contact plug; a sixth step of etching the interlayer insulation film and removing the etching stopper on the gate electrode; a seventh step of forming an interlayer insulation film over an entire surface of the substrate; an eighth step of etching the interlayer insulation film so as to expose the etching stopper on a diffusion layer, and etching the insulation film of the gate electrode, so as to form contact holes on the diffusion layer and the gate electrode; a ninth step of removing the etching stopper exposed on the diffusion layer; and a tenth step of filling the contact hole formed by the eighth step and the ninth step, so as to form the contact plugs.

In a second aspect of the present invention, in the sixth step, $CH_4$ and $CHF_3$ gases are used as an etching gas.

In a third aspect of the present invention, in the sixth step, an etching rate of the interlayer insulation film and the etching stopper is higher than that of the contact plug formed in the fourth step.

In a fourth aspect of the present invention, in the eighth step, $C_4F_8$, Ar, CO, and $O_2$ gases are used as an etching gas.

In a fifth aspect of the present invention, in the eighth step, an etching rate of the interlayer insulation film is higher than that of the etching stopper.

In a sixth aspect of the present invention, in the ninth step, $CHF_3$, Ar, and $O_2$ gases are used as an etching gas.

By doing the above, because there is no etching stopper on the gate electrode, over-etching of the diffusion layer and field oxide film are prevented when contact hole etching is done, thereby enabling the formation of a device having stable element separation characteristics.

DESCRIPTION OF THE PREFERRED EMBODIMENTS

Embodiments of a method for fabricating a semiconductor device according to the present are described in detail below, with references made to relevant accompanying drawings.

FIG. 2 to FIG. 6 show a method for fabricating a semiconductor device according to the present invention.

In these drawings, FIG. 2(a) shows the first step, whereby a polysilicon film 203 and an insulation film 204 are formed on a semiconductor substrate 201, and then the polysilicon film 203 and insulation film 204 are etched to a prescribed shape, so as to form a gate electrode 203, after which an etching stopper 205 is formed over the entire surface of the substrate and an interlayer insulation film 206 is formed over the entire surface thereof.

FIG. 2(c) show the second step, whereby a contact hole 208 is formed in the interlayer insulation film 206 that reaches the semiconductor substrate, so as to cause the etching stopper 205 on the semiconductor substrate to be exposed.

FIG. 3(a) shows the third step, whereby the exposed etching stopper 205 on the semiconductor substrate 201 is removed.

FIG. 3(b) shows the fourth step, whereby the contact hole 208 is filled to form a contact plug 210.

FIG. 3(c) shows the fifth step, whereby the film 209 deposited on the interlayer insulation film 206, when the contact plug 210 is formed, is removed, so as to expose the contact plug 210.

FIG. 4(a) shows the sixth step, whereby the interlayer insulation film 206 is etched and the etching stopper 205 on the gate electrode 203 is removed.

FIG. 4(b) shows the seventh step, whereby an interlayer insulation film 211 is formed over the entire surface of the substrate.

FIG. 5(a) shows the eighth step, whereby the interlayer insulation films 211 and 206 are etched, so as to expose the etching stopper 205 on the diffusion layer 231, and the insulation film 204 of the gate electrode 203 is etched, so as to form a contact hole 213 on the diffusion layer 231 and the gate electrode 203.

FIG. 5(b) shows the ninth step, whereby the etching stopper 205 exposed on the diffusion layer 231 is removed.

FIG. 6(a) shows the tenth step, whereby the contact hole 213 form by the eighth and ninth steps is filled, so as to form a contact plug 215.

The present invention is described in further detail below.

The method of fabricating a semiconductor device according to the present invention is illustrated in FIG. 2 to FIG. 6, which shows cross-section views of a memory device.

As shown in FIG. 2(a), a gate electrode 203 having a width of 0.2 μm and a height of 200 nm, and a 200-nm insulation layer made of a silicon oxide film, a silicon nitride film or a oxide nitride film are formed in the memory cell part on the silicon substrate 201 and the element separation region 202, with an interval of 0.2 μm. In the surrounding area, a gate electrode 203 having a minimum width of 0.3 μm is formed, with an interval of 0.8 μm. A conventional CVD process is used to deposit a silicon nitride film 205 serving as an etching stopper for a self-aligning contact process, so as to cover the gate and the silicon substrate, and then a BPGS film 206 is formed as an interlayer insulation film. When this is done, the thickness from the surface of the silicon substrate to the upper surface of the interlayer insulation film is, for example, 800 nm.

Figure 1:
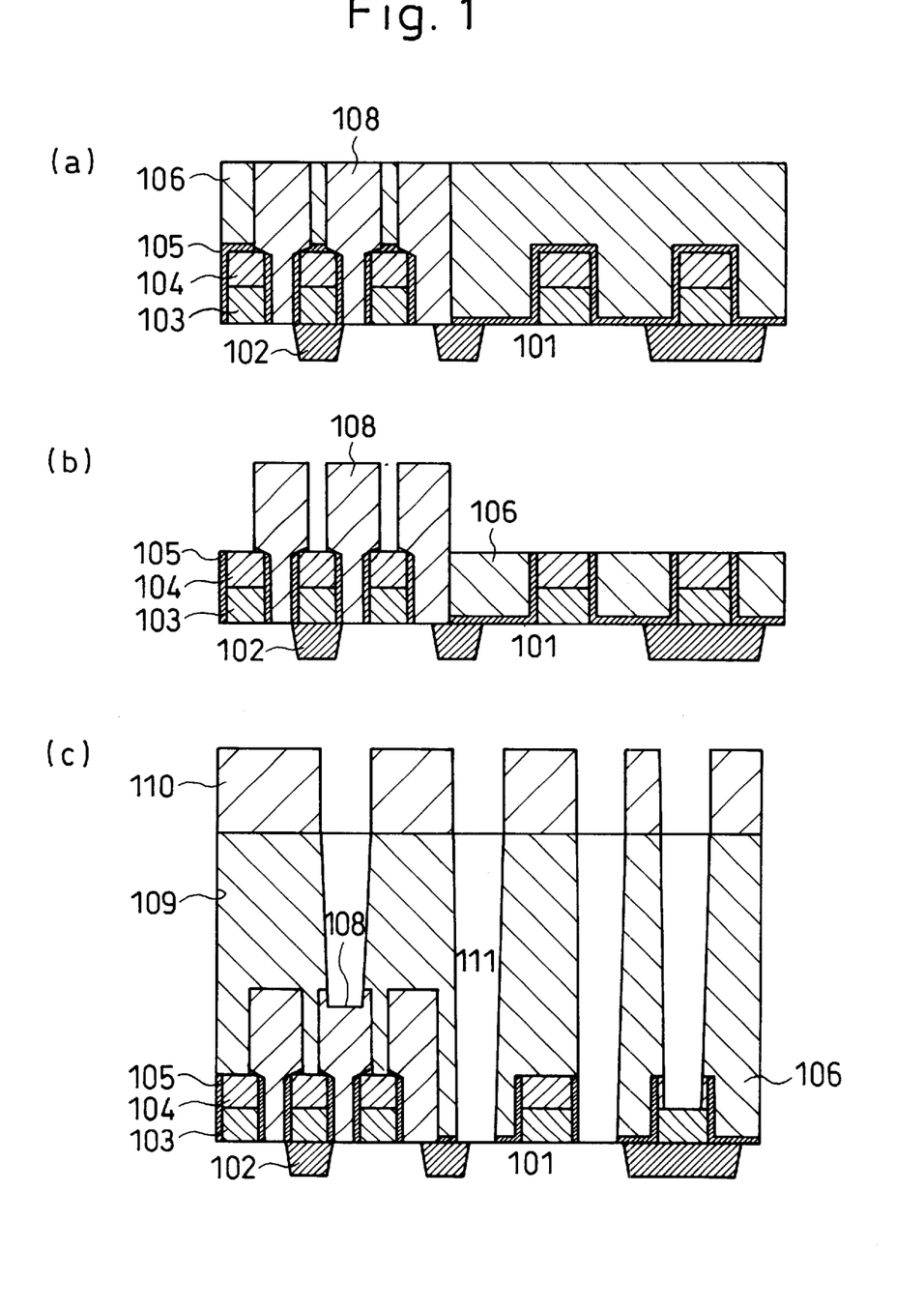
FIGS. 1(a)–1(c) are drawings showing an embodiment of a method for fabricating a semiconductor device according to the present invention.
Figure 2:
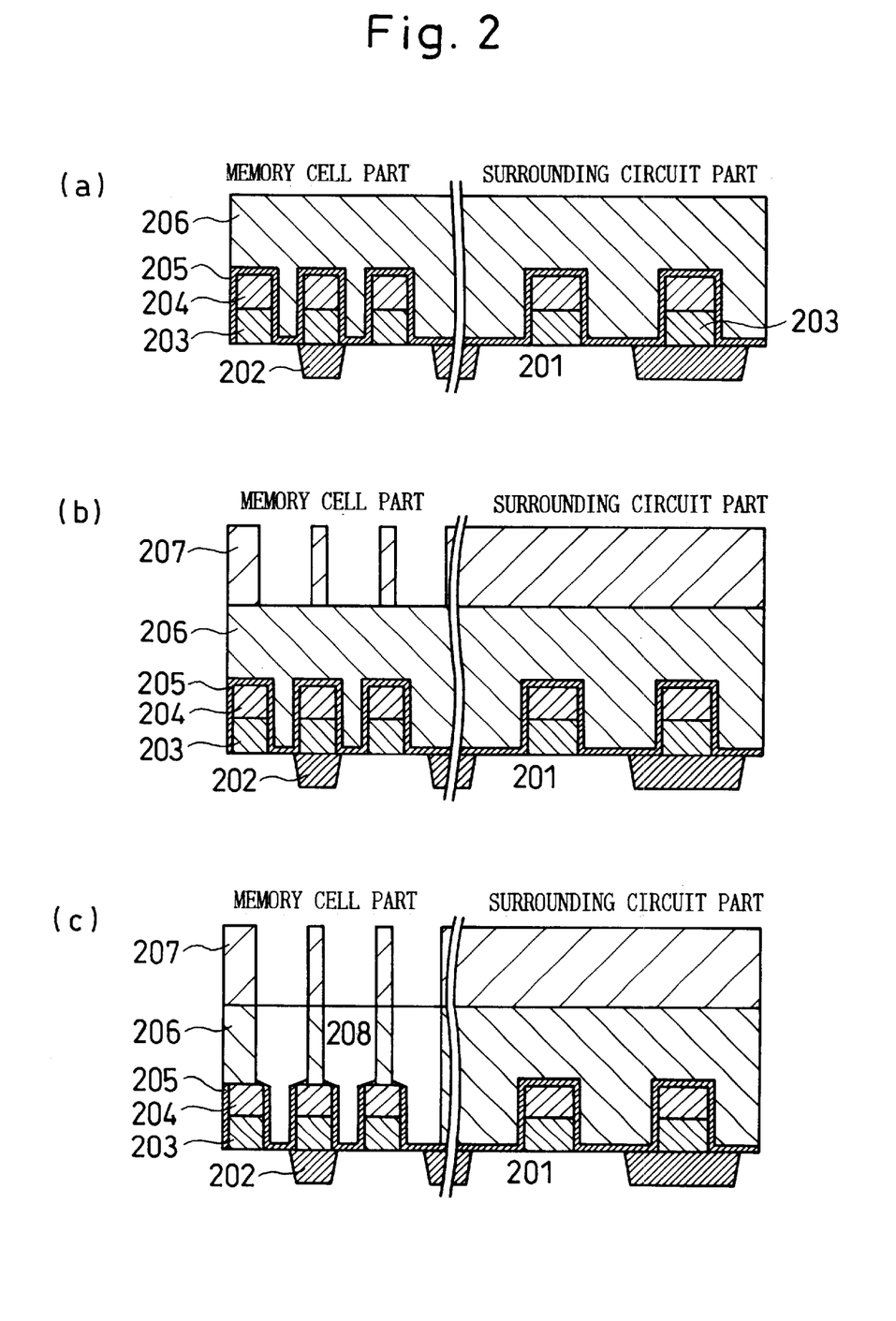
FIGS. 2(a)–2(c) are cross-section views showing the process steps of a method of fabricating a semiconductor device according to the present invention.
Figure 3:
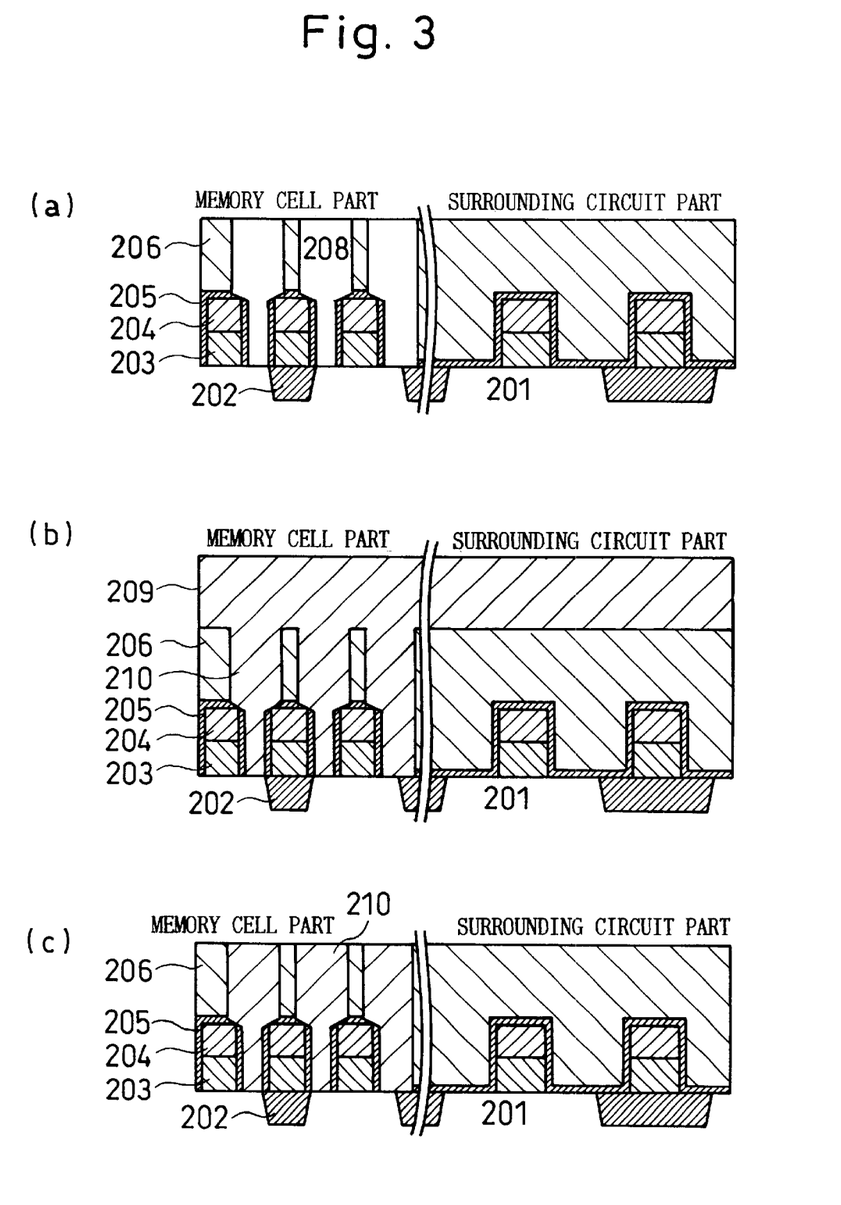
FIGS. 3(a)–3(c) are cross-section views showing process steps subsequent to those shown in FIG. 2.
Figure 4:
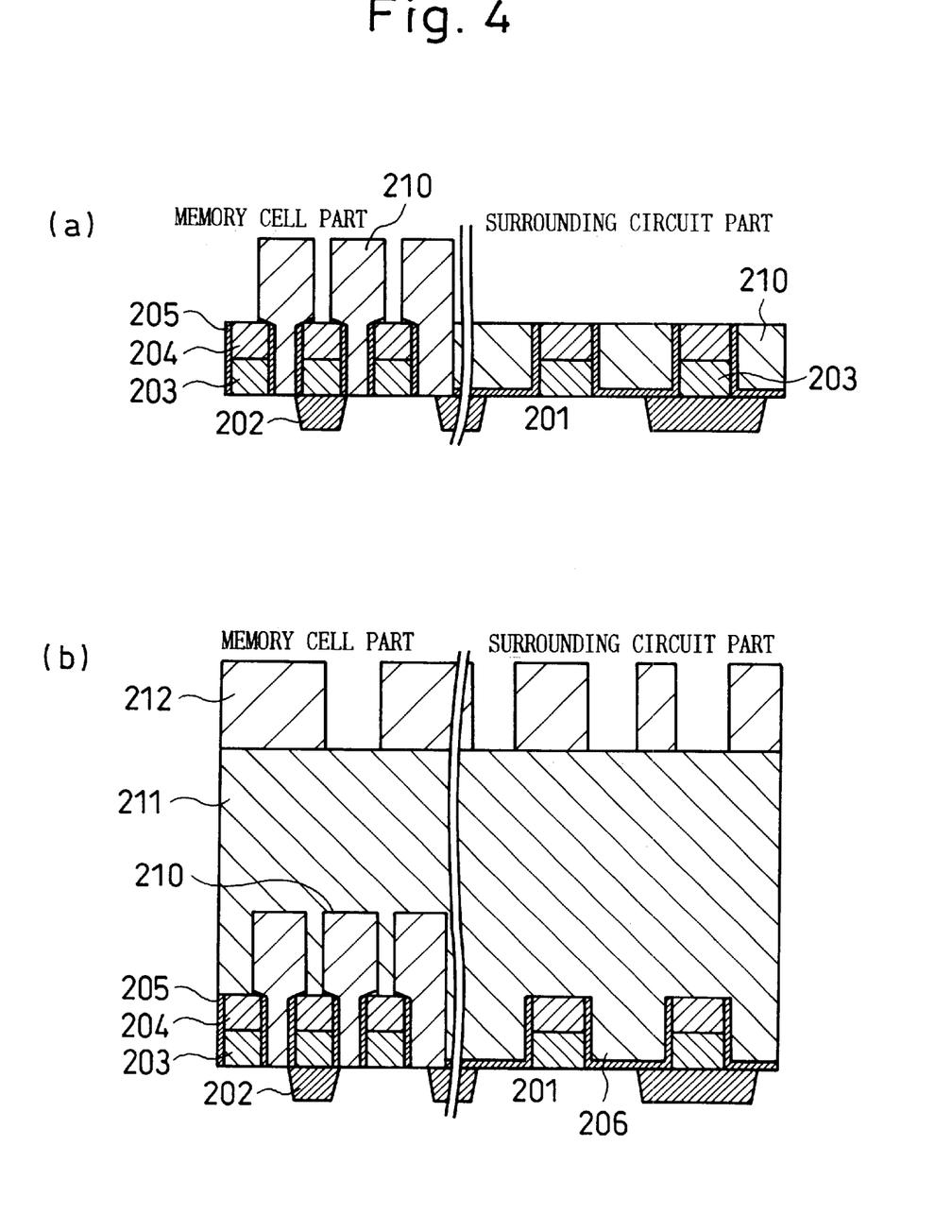
FIG. 4(a) and FIG. 4(b) are cross-section views showing process steps subsequent to those shown in FIG. 3.
Figure 5:
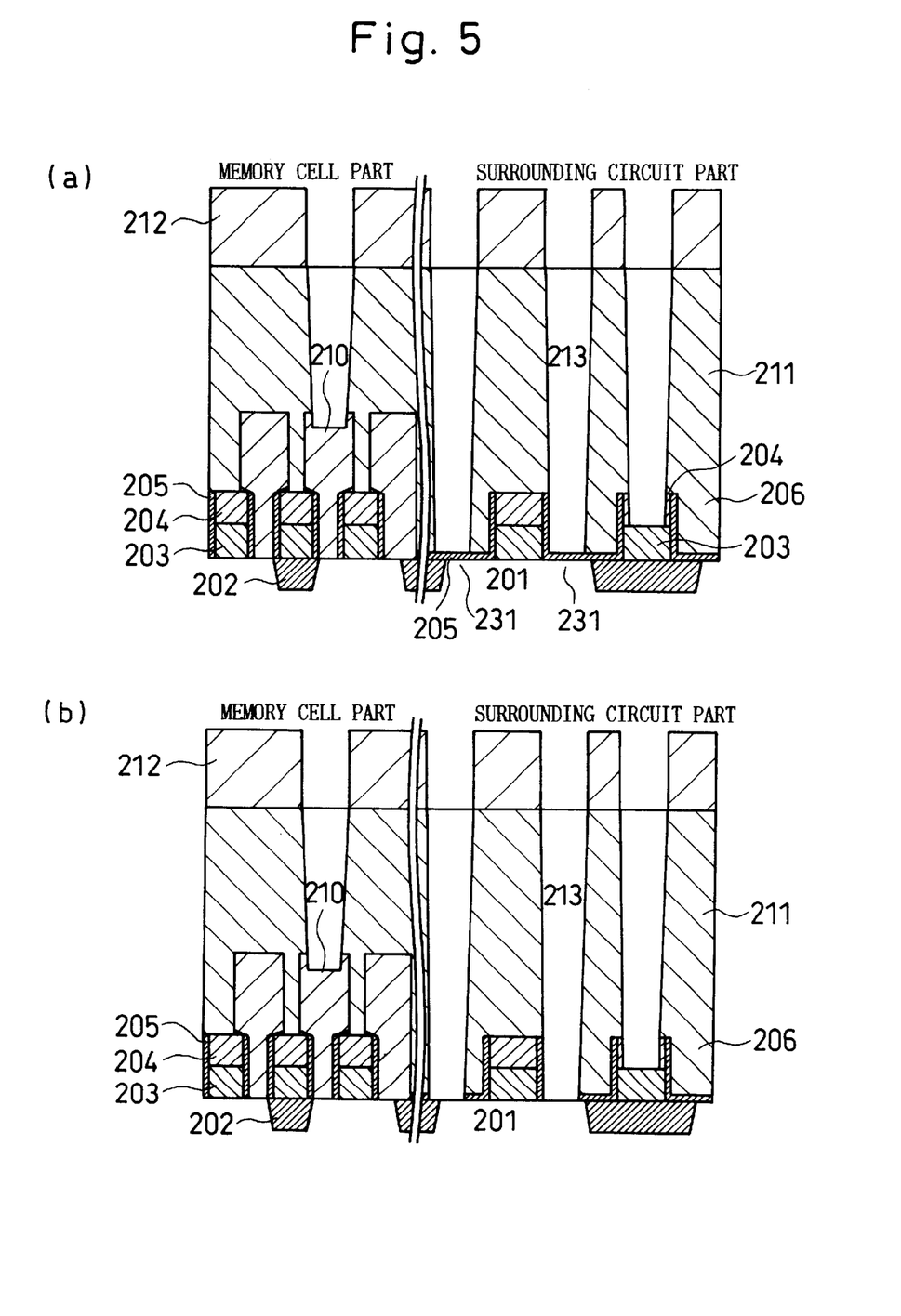
FIG. 5(a) and FIG. 5(b) are cross-section views showing process steps subsequent to those shown in FIG. 4
Figure 6:
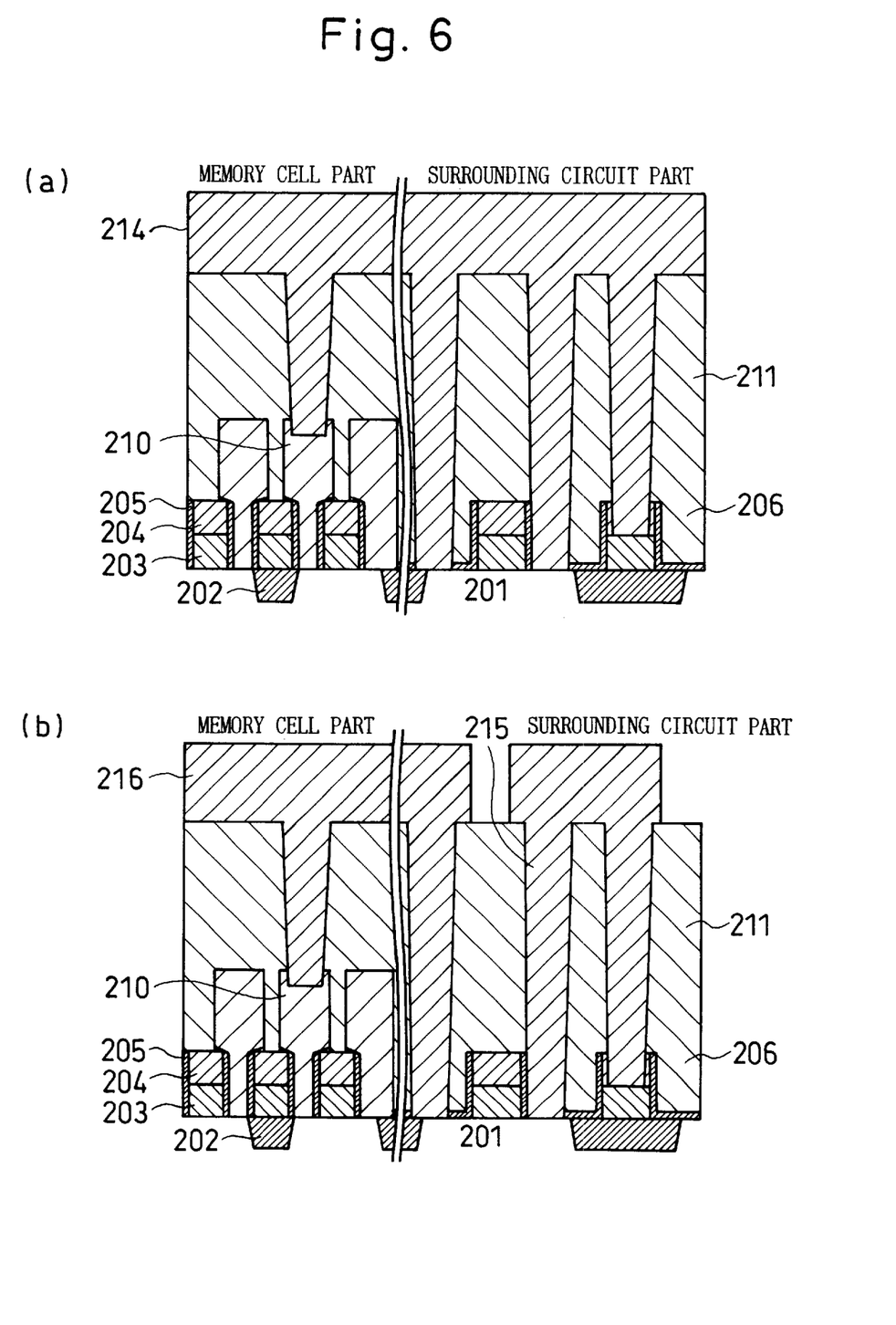
FIG. 6(a) and FIG. 6(b) are cross-section views showing process steps subsequent to those shown in FIG. 5.

In the memory cell part shown in FIG. 2(b), a lithographic process is used to pattern photoresist 207, and to pattern a contact hole that is 0.3 μm, which is larger than the gate electrode spacing. Then, as shown in FIG. 2 (c), an oxide film etching apparatus is used to etch a BPSG film 206, after which, as shown in FIG. 3(a), the silicon nitride film 205 on the semiconductor substrate is etched and the photoresist 207 are peeled off, thereby forming the contact hole 208.

As shown in FIG. 3(b), a CVD process is used to deposit phosphorus-doped polysilicon within the contact hole 208 and on the interlayer film 206. To remove the polysilicon on the interlayer film 206, a silicon etching apparatus using chlorine or oxygen or the like as an etching gas, is used to etch the entire surface, thereby forming the contact plug 210 as shown in FIG. 3(c).

In the condition with the exposed contact plug 210, an oxygen dry etching apparatus is used to perform etching of the BPSG film and the etching stopper silicon nitride film 205, so as to expose the upper surface of the gate electrode 203. The dry etching apparatus is, for example, a flat-sheet type RIE apparatus, with an RF frequency of 13.56 MHz, the etching conditions being, for example, a pressure of 5 Pa, a gas flow of $CF_4$ and $CHF_3$ of 50 and 10 sccm, an electrode temperature of 50° C., and an RF power of 1200 W, under which conditions the etching rates for a silicon oxide film, a silicon nitride film, and polysilicon are 600 nm/minute, 500 nm/minute, and 100 nm/minute, respectively. To control the amount of etching, an end-point detector that monitors the change in emitted light from the plasma is used. For example the emitted wavelength of CO of 483 nm and the emitted wavelength of CN of 388 nm are monitored to detect a change in intensity, thereby enabling etching up until the upper surface of the gate electrode 203.

By the above-noted etching, as shown in FIG. 4(a), the nitride film is left on the diffusion layer, without any remaining nitride film 205 of the gate. Because the etching rate of polysilicon is low, the contact plug 210 remains in substantially its original shape.

The dry etching method can alternatively be that in which, after etching the BPSG film 206 under conditions for which the etching rate for the silicon oxide film is higher than the etching rate for the silicon nitride film, the silicon nitride film is etched.

After the above, as shown in FIG. 4(b), a BPSG film is formed by a CVD process, and thermal treating is done in a nitrogen atmosphere, so as to cause reflow, thereby forming an interlayer insulation film 211. Then, a photoresist 212 is applied and a lithographic process is used to form a contact pattern on the contact plug 210, the gate electrode, and the diffusion layer.

Figure 7:
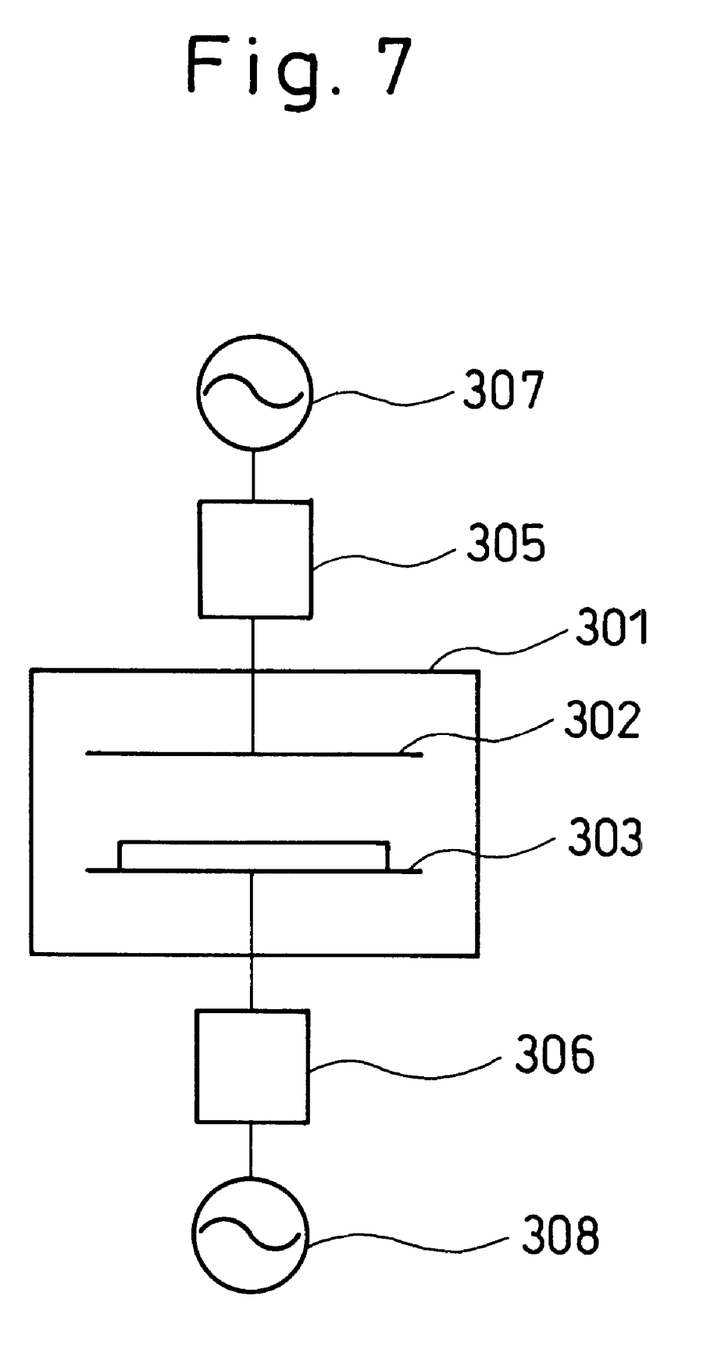
FIG. 7 is a drawing showing a simplified view of an etching apparatus according to the present invention.

Then, for example, as shown in FIG. 7, an etching apparatus having two opposing electrodes, an upper electrode 302 and a lower electrode 303, in a chamber 301 having a gas supply mechanism at the top and a gas exhaust mechanism at the bottom, with the electrodes connected to RF sources 307 and 308 via respective matching boxes 305 and 306, is used to, as shown in FIG. 5(a), etch the BSPG films 211 and 206, and the silicon oxide film 204. When this is done, the RF frequencies in the etching apparatus are 27 MHz at the upper electrode and 800 kHz at the lower electrode, the RF powers being 2000 W at the upper electrode and 1400 W at the lower electrode, the pressure being 25 mTorr, the gas flows for $C_4F_8$, Ar, CO, and $O_2$ being, 20, 300, 100, and 10 sccm, respectively, and the lower electrode temperature being −20° C. Under these conditions, the etching rates for the BSPG film and the silicon nitride film are 600 nm/minute and 50 nm/minute, respectively. If this etching rate difference is used, it is possible to stop the etching at the silicon nitride film 205 on the silicon substrate 201.

Next, for example, using the etching apparatus of FIG. 7 with etching conditions such as an RF power of 1500 W and 1400 W at the top and bottom parts, a pressure of 50 mTorr, gas flows of $CHF_3$, Ar, and $O_2$ of 30, 200, and 10 sccm, respectively, and a lower electrode temperature of −20° C. the silicon nitride film 205 is etched, so as to expose the silicon substrate 201 as shown in FIG. 5(b). When this is done, it is possible to perform control so that over-etching of the silicon substrate 201 does not occur, and it is possible to prevent worsening of the element separation characteristics and contact leakage.

After peeling off the photoresist, as shown in FIG. 6(a), sputtering of a barrier metal is done, and a CVD process is used to deposit a film of tungsten 214, thereby forming a contact plug.

After the above, as shown in FIG. 6(b), interconnect patterning and etching are performed to form the contact plug 215 and metal interconnect layer 216, thereby electrically connecting the gate electrode, the contact plug, and the diffusion layer.

In the application example of this embodiment, there is no restriction to the materials cited and the values given in the description thereof.

By adopting the above-described constitution, a method for fabricating a semiconductor device according to the present invention prevents over-etching of the diffusion layer and field oxide films on the silicon substrate without the need to increase the number of photolithography process steps, thereby achieving a device with superior stability and no contact leakage.

What is claimed is:

1. A method for fabricating a semiconductor device having a contact plug, said method comprising the steps of:

a first step of forming a polysilicon film and an insulation film on a semiconductor substrate, and then etching said polysilicon film and said insulation film to a prescribed shape, so as to form a gate electrode, after which an etching stopper is formed on substantially an entire surface of said substrate and an interlayer insulation film is formed over said entire surface thereof;

a second step of forming a contact hole that reaches said semiconductor substrate in said interlayer insulation film, so as to cause a portion of said etching stopper on said semiconductor substrate to be exposed;

a third step of removing substantially all of said exposed portion of said etching stopper on said semiconductor substrate;

a fourth step of filling said contact hole to form a contact plug;

a fifth step of removing substantially all a film that is deposited on said interlayer insulation film when said contact plug is formed, so as to expose said contact plug;

a sixth step of etching substantially all of said interlayer insulation film and removing said etching stopper from at least a part of a top portion of said gate electrode;

a seventh step of forming an interlayer insulation film over an entire surface of said substrate;

an eighth step of etching said interlayer insulation film so as to expose at least a portion of said etching stopper on a diffusion layer of said semiconductor substrate and exposing at least a portion of said insulation film having said prescribed shape of said gate electrode, and etching said insulation film of said gate electrode to expose at least a portion of said polysilicon film, so as to form contact holes on said diffusion layer and said gate electrode;

a ninth step of removing said etching stopper exposed on said diffusion layer; and a tenth step of filling said contact hole formed by said eighth step and said ninth step, so as to form said contact plugs.

2. A method for fabricating a semiconductor device according to claim 1, wherein in said sixth step, at least one of $CH_4$ and $CHF_3$ gases are used as an etching gas.

3. A method for fabricating a semiconductor device according to claim 1, wherein in said sixth step, an etching rate of said interlayer insulation film and said etching stopper is higher than an etching rate of said contact plug formed in said fourth step.

4. A method for fabricating a semiconductor device according to claim 1, wherein in said eighth step, at least one of $C_4F_8$, Ar, CO, and $O_2$ gases are used as an etching gas.

5. A method for fabricating a semiconductor device according to claim 1, wherein in said eighth step, an etching rate of said interlayer insulation film is higher than an etching rate of said etching stopper.

6. A method for fabricating a semiconductor device according to claim 1, wherein in said ninth step, at least one of $CHF_3$, Ar, and $O_2$ gases are used as an etching gas.

7. A method for fabricating a semiconductor device according to claim 1, wherein a material in said fourth step comprises polycrystalline silicon.

8. A method for fabricating a semiconductor device according to claim 1, wherein a material in said tenth step comprises a metal.

9. A method for fabricating a semiconductor device according to claim 7, wherein said polycrystalline silicon comprises a deposited phosphorus doped silicon.

10. A method for fabricating a semiconductor device according to claim 8, wherein said metal comprises a refractory metal.

11. A method for fabricating a semiconductor device according to claim 10, wherein said refractory metal comprises tungsten.

* * * * *